United States Patent [19]
Pulvirenti et al.

[11] Patent Number: 5,760,613
[45] Date of Patent: Jun. 2, 1998

[54] METHOD AND CORRESPONDING CIRCUIT DETECTING AN OPEN LOAD

[75] Inventors: Francesco Pulvirenti, Acireale; Roberto Gariboldi, Lacchiarella, both of Italy

[73] Assignees: SGS-Thomson Microelectronics S.r.l., Agrate Brianza; Consorzio per la Ricerca sulla Microelettronica nel Mezzogiorno, Catania, both of Italy

[21] Appl. No.: 648,502

[22] Filed: May 15, 1996

[30] Foreign Application Priority Data

May 16, 1995 [EP] European Pat. Off. ............ 95830204

[51] Int. Cl.$^6$ .................... H03K 17/18; G05F 1/565
[52] U.S. Cl. ...................... 327/67; 327/78; 327/543
[58] Field of Search .................... 327/581, 20, 59, 327/60, 63, 67, 68, 72, 73, 77, 78, 79, 80, 81, 82, 87, 89, 538, 543; 340/825.15, 825.16, 635, 652

[56] References Cited

U.S. PATENT DOCUMENTS

| | | | |
|---|---|---|---|
| 4,661,717 | 4/1987 | Nishioka | 315/83 |
| 4,831,483 | 5/1989 | Matsumura et al. | 361/98 |
| 4,885,477 | 12/1989 | Bird et al. | 327/52 |
| 5,079,456 | 1/1992 | Kotowski et al. | 327/537 |
| 5,113,089 | 5/1992 | Osawa | 327/77 |
| 5,220,207 | 6/1993 | Kovalcik et al. | 327/362 |
| 5,272,392 | 12/1993 | Wong et al. | 327/584 |
| 5,374,857 | 12/1994 | Carobolante | 327/581 |
| 5,408,141 | 4/1995 | Devore et al. | 327/581 |
| 5,438,286 | 8/1995 | Pavlin et al. | 327/50 |

FOREIGN PATENT DOCUMENTS

| | | | |
|---|---|---|---|
| A-0 287 919 | 10/1988 | European Pat. Off. | G01R 31/02 |
| A-0 594 517 | 4/1994 | European Pat. Off. | H03K 17/18 |

*Primary Examiner*—Timothy P. Callahan
*Assistant Examiner*—Terry L. Englund
*Attorney, Agent, or Firm*—Wolf, Greenfield & Sacks, P.C.

[57] ABSTRACT

A method for detecting an open load includes the use of a driver having at least one main power transistor connected to the load and one auxiliary transistor connected in parallel with the main transistor between a first power supply voltage reference and a second voltage reference. The method compares a first voltage present on a terminal connected to the load of the main transistor with a second voltage present on a terminal of the auxiliary transistor. A circuit for detecting an open load performs the method.

17 Claims, 2 Drawing Sheets

METHOD AND CORRESPONDING CIRCUIT DETECTING AN OPEN LOAD

BACKGROUND OF THE INVENTION

1. Field of the Invention

This invention relates to a method and a circuit for detecting an open load.

More particularly, the invention relates to a method for detecting an open load with increased sensitivity.

2. Discussion of the Related Art

Circuits for detecting open loads may be used in the field of programmable process controllers, which are used, for example, in automated production lines of industrial systems.

An automated production line essentially comprising a processing unit, or processor, which exchanges information with peripheral units located along the production line. These peripheral units may be, for example, solenoid valves, lamps, motors, etc., and the connections to the processor are made by connecting wires up to 400 meters in length, terminating at an input/output interface.

A good diagnostic system associated with the processor is able to minimize the time required for tracing faults, and to reduce the cost of identifying and rectifying them. An example of such a cost is that associated with the loss of production which occurs immediately in an assembly line as a result of the interruption of a line or a break in the winding of a solenoid valve.

In this context, it is particularly useful to be able to measure the absence of current in an output stage of the processor. The absence of current indicates the interruption of a connecting wire or a break in a winding of an actuator present in a peripheral.

As is well known, the output stage 1 of an industrial processor is normally made with MOS power transistors in a "high side driver" configuration, as illustrated in the attached FIG. 1.

This output stage 1 comprises a power switch, in particular a MOS power transistor M1, having a drain terminal D1 connected to a power supply voltage reference Vs, a source terminal S1 connected to a second voltage reference, for example an earth GND, through a load L, and a gate terminal G1 connected to a sensor 2.

More particularly, the power transistor M1 comprises a number N1 of elementary MOS cells.

The sensor 2 is connected in turn to the power supply voltage reference Vs and to the second voltage reference GND through a reference voltage generator GN1.

The sensor 2 is also connected to a first non-inverting (+) input terminal II of a comparator 3.

A second, inverting (−) input terminal I2 of the comparator 3 is connected to the source terminal S1 of the power transistor M1.

In particular, the sensor 2 comprises a MOS transistor M2, having a drain terminal D2 connected to the power supply voltage reference Vs, a gate terminal G2 connected to the gate terminal G1 of the power transistor M1, and a source terminal S2 connected to the reference voltage generator GN1.

The transistor M2 comprises a number N2 of elementary MOS cells.

A conventional method of diagnosis of the output stage 1 provides for the detection of the value of a saturation voltage $V_{SAT}$ of the power transistor M1, in other words the value of the voltage drop across the saturation resistance of the power transistor M1. This method, however, cannot be used to detect variations of a few mA when the power transistor, at low saturation resistance, is fully on.

In fact, according to the circuit configuration shown in FIG. 1, when an open load occurs, the current threshold $I_1$ is determined by the following equation:

$$I_1 = (N1/N2)*I_{REF} - Voff/Ronp \qquad (1)$$

where $I_{REF}$ is the reference current supplied by the generator GN1,

Voff is the offset voltage of the comparator 3, and

Ronp is the drain-source resistance of the power transistor M1 when it is on.

The term Voff/Ronp limits the minimum current detectable with this configuration when the power transistor is on and, consequently, the saturation voltage $V_{SAT}$ determined by the equation $$V_{SAT} = R_{SAT}*I_1 \qquad (2)$$

where $R_{SAT}$ is the saturation resistance of the power transistor M1.

In the case of an output stage 1 of an industrial process controller it may be necessary to measure variations of output current $I_1$ less than 3 mA for a power transistor M1 with a saturation resistance $R_{SAT}$ of 70 mΩ, in other words a saturation voltage $V_{SAT}$ of approximately 210 μV, which is therefore too small to be detected by the technique illustrated above.

A first solution to enable small variations of output current to be measured has been described in the article "Driver intelligenti per controllori industriali" (Intelligent drivers for industrial controllers) by Herbert Sax and Michael Barou, published in the journal "Elettronica Oggi" on 30 Jun. 1992.

The method proposed in this article can be applied with a circuit architecture 4 illustrated in FIG. 2.

The architecture 4 comprises a MOS power transistor M3 connected between a first power supply voltage reference Vs and a circuit node X1 connected to a first inverting (−) input terminal I3 of a comparator 5. This comparator 5 has a second, non-inverting (+) input terminal I4 connected to the power supply voltage reference Vs through a constant voltage generator GN2.

A load L is connected between the circuit node X1 and a second voltage reference, for example an earth GND.

The power transistor M3 has a gate terminal G3 connected to a gate terminal G4 of an auxiliary MOS transistor M4 connected between the said circuit node X1 and the power supply voltage reference Vs and connected to this reference through a detection resistance R1.

The auxiliary transistor M4 comprises a number N4 of elementary MOS cells which is a submultiple of the number N3 of cells contained in the power transistor M3 (N4=N3/n, where n is any whole number). Part of a load current $I_L$ runs through the transistor M3.

The transistors M3 and M4 have their source terminals, S3 and S4 respectively, connected to the load L. They also have their gate terminals G3 and G4 in common and connected to a control circuit 6 connected between the second voltage reference GND and a third control voltage reference $V_{cp}$.

The comparator 5 has an output terminal O2 connected to the said control circuit 6.

The auxiliary transistor M4 has its drain terminal D4 connected to a first inverting (−) input terminal I5 of a further comparator 7.

The comparator 7 has a second non-inverting (+) input terminal I6 connected to the power supply voltage reference Vs through a voltage generator GN3 and an output terminal O3, which signals when the load L is open.

In particular, the control circuit 6 comprises a further MOS transistor M5 having a source terminal S5 connected to the second earth reference GND, a gate terminal G5 connected to the output terminal O2 of the comparator 5 and a drain terminal D5 connected to the gate terminal G4 of the auxiliary transistor M4 and to a switch SW1, which in turn is connected to the third control voltage reference $V_{CP}$ through a further current generator GN4.

The switch SW1 is controlled by an ON signal external to the architecture 4.

We shall now examine the method of detection according to the architecture 4, which is based on the measurement of the current passing through the resistance R1.

To ensure that the voltage drop across the transistors M3 and M4 does not approach zero for very small load currents, or for an open load L, while maintaining the voltage drop across the resistance R1 at measurable levels, the architecture 4 provides for the control circuit 6 to be connected in a negative feedback loop which connects the circuit node X1 to the gate terminal G4 of the transistor M4 through the comparator 5.

This feedback loop prevents the voltage drop between the source terminal S3 and the drain terminal D3 of the transistor M3 from falling below a voltage $V_R$ supplied by the voltage generator GN2.

In other words, with small load currents the two MOS transistors M3 and M4 operate in saturation conditions, working in analog mode and no longer as switches.

Although certain aspects of this first solution are advantageous, it has a number of disadvantages, as follows:
- the transistors M3 and M4 have their drain terminals D3 and D4 separate: they cannot therefore be made in a single pocket, and this diminishes the precision of the device, since the coupling between the structures becomes less effective. Moreover, in the technologies for construction of integrated circuits in which the drain terminal is made to coincide with the substrate on which the circuit is formed, for example in VIP technology, the circuit architecture 4 cannot be produced;
- the voltage drop across the detection resistance R1 alters the drain-source voltage of the auxiliary transistor M4, thus changing the value of the current mirrored by it and further reducing the precision of the circuit.

This last problem is highly disadvantageous in cases in which the open load current to be detected is very small; in these conditions, the transistors M3 and M4 operate below the threshold, in other words with drain voltages highly dependent on the drain-source current altered by the voltage drop across the resistance R1.

A second known solution, based on a completely different approach to the circuit from that described immediately above, is described in the article "A New Open Load Circuit for Very Low Current Level Detection" by Jean-Luis Siaudeau, published in "Power Conversion June 1994 Proceedings".

This method of detection is used in the device 8 illustrated in FIG. 3.

The device 8 comprises a MOS power transistor M6 connected between a first power supply voltage reference Vs and an output terminal O3.

The device 8 comprises a further auxiliary MOS power transistor M7 connected between the power supply voltage reference Vs and the output terminal O3, which in turn is connected to a second voltage reference, for example an earth GND, through the load L.

The transistors M6 and M7 have their drain terminals D6 and D7 and their source terminals S6 and S7 connected to each other, and also to the power supply voltage reference Vs and to the output terminal O3 respectively.

The transistor M6 receives a main control signal ON1 at its gate terminal G6, while the auxiliary transistor M7 has its gate terminal G7 connected to the gate terminals G8 and G9 of two further MOS power transistors M8 and M9 respectively, connected in parallel with each other, between the power supply voltage reference Vs and the second voltage reference GND.

The transistors M8 and M9 have their drain terminals D8 and D9 connected to each other and to the power supply voltage reference Vs and receive a common auxiliary control signal ON2 at their gate terminals G8 and G9.

The transistor M8 has its source terminal S8 connected to the second voltage reference GND through a current generator GN5 and to a first input terminal I7 of a control logic circuit 9 which in turn is connected between the output terminal O3 and a second output terminal O4.

The transistor M9 has its source terminal S9 connected to the second voltage reference GND through a further current generator GN6 and to a second input terminal I8 of the control logic circuit 9.

The power transistors M6 and M7 of the device 8 have their drain terminals D6 and D7 in common. This solution may therefore be implemented in technologies in which the drains of the power transistors coincide with the substrate of the integrated circuit, such as VIP technology.

The device 8 also uses an auxiliary power transistor M7 with a saturation resistance $R_{SAT2}$ which is higher than the saturation resistance $R_{SAT1}$ of the power transistor M6, known as the main transistor.

In normal operating conditions, the two transistors M6 and M7 operate in parallel, and the saturation resistance $R_{SAT}$ of the device 8, which is the result of the parallel connection of the saturation resistances $R_{SAT1}$ and $R_{SAT2}$ of the transistors M6 and M7 is practically identical to the saturation resistance $R_{SAT1}$ of the main transistor M6.

However, if the load L becomes open, the main power transistor M6 goes off when the current passing through it reaches a first threshold $I_{R1}$, equal to the current supplied from the current generator GN5 multiplied by the W/L ratio of the areas of the transistors M6 and M7.

When the transistor M6 is turned off, all the load current flows through the auxiliary transistor M7.

It is therefore possible to make a more accurate measurement of the load current from the saturation resistance $R_{SAT2}$ of the auxiliary transistor M7, which has a higher value than the saturation resistance $R_{SAT}$ of the circuit in normal conditions.

Although it meets the requirements, this solution also has certain problems, such as the following:
- the main power transistor M6 and auxiliary power transistor M7 of the device 8 have their gate terminals G6 and G7 separate: these therefore require separate drivers, thus considerably increasing the complexity of the device's circuit;
- when the load current decreases, there is a switch from the main transistor M6 to the auxiliary transistor M7: this causes a peak in the output voltage.

SUMMARY OF THE INVENTION

The present invention therefore provides a method and a circuit for detecting the load current when the load becomes open which overcomes the limitations and/or problems which have hitherto limited the solutions in the known art.

The concept on which the present invention is based is that of forcing the operation of the power transistors in the region of near-saturation, even at very low load currents.

According to one aspect of the present invention, there is provided a method for detecting an open load. The method is practiced in a circuit in which the load is supplied with a current by a main transistor having a gate terminal. The circuit further includes an auxiliary transistor having a gate terminal connected to the gate terminal of the main transistor, the auxiliary transistor having an output terminal separate from that of the main transistor. The method includes a step of comparing a first voltage present at a terminal of the main transistor connected to supply the current to the load with a second voltage present at the output terminal of the auxiliary transistor. Several variations on this basic method are contemplated. Some examples are now given. The method may further include a step of holding the second voltage constant at a reference value by applying a bias current to the output terminal of the second transistor. As the load current drops below a threshold value, this method may further keep the first voltage above the reference value by means of a negative feedback network connected to receive the first voltage as an input and having an output connected to the gates of the main and auxiliary transistors. The main and auxiliary transistors may thus be kept in a near-saturation operating region. Finally the biasing current of the above method may be set to a ratio related to the threshold value and the areas of the main transistor and the auxiliary transistor.

According to a second aspect of this invention, there is provided a circuit for detecting an open load, comprising a main transistor having a gate terminal and having an output terminal connected to the load; an auxiliary transistor having a gate terminal connected to the gate terminal of the main transistor; a control circuit connected between the output terminal of the said main transistor and the gate terminal of the auxiliary transistor, maintaining the main transistor and the auxiliary transistor in a near-saturation operating region; a comparator having an output carrying a voltage indicative of an open load, a first input connected to the output terminal of the main transistor and a second input connected to a terminal of the auxiliary transistor; and a biasing circuit for the auxiliary transistor connected between the second input and a voltage reference. This aspect of the invention may be varied is numerous ways. A few illustrative examples are now given. In the described circuit, the main transistor may comprise a number of elementary cells, the number of which is equal to a whole number multiplied by a number of elementary cells contained in the auxiliary transistor. The biasing circuit may comprise a current generator which supplies a biasing current equal to a ratio between a threshold value and the ratio of the areas of the main transistor and auxiliary transistor. The comparator may be constructed of a design including hysteresis. In many variations, the main transistor and auxiliary transistor may be implemented as field-effect transistors and have their gate terminals in common and connected to an interface circuit comprising a third voltage reference and a switch controlled by a control signal. Finally, in accordance with a variation of this second aspect of the invention, the main transistor and auxiliary transistor may have their drain terminals in common and connected to the power supply voltage reference.

In accordance with yet a third aspect of the invention, there may be provided a circuit which includes means having a control terminal and an output terminal, the output terminal connected to the load, for supplying to the load a load current; means having a control terminal and an output terminal, the output terminal connected to a biasing circuit, for establishing a reference voltage; and means having an output indicative of an open load and input terminals connected to the output terminals of the means for supplying and the means for establishing, for comparing the reference voltage with a voltage produced by supplying to the load the load current and setting the output indicative of an open load according to the comparison. The circuit according to this aspect of the invention may further include a control circuit having an output connected to the control terminals of the means for supplying and the means for establishing, whereby supplying to the load the load current is modulated. In yet another variation of this aspect of the present invention, the control circuit may further include means having an input connected to the output of the means for supply for controlling the output of the control circuit to select a predetermined current operating point of the means for supplying.

In accordance with yet a fourth aspect of the invention, there is provided a circuit for detecting an open load, comprising: a first transistor having an output terminal supplying a current to a load and a control terminal; a second transistor having an output terminal held at a constant voltage by a biasing current applied thereto and having a control terminal connected to the control terminal of the first transistor; a feedback circuit connected to the output terminal of the first transistor and responsive to a voltage present thereat and producing an output connected to the control terminals of the first and second transistors, operating to hold the first and second transistors in a near-saturation condition; and a first comparator having two inputs connected to the output terminal of the first transistor and the output terminal of the second transistor respectively, the first comparator having an output carrying a voltage indicative of an open load. This aspect of the invention may be varied as follows. The first transistor and the second transistor may be field effect transistors. The feedback circuit may further comprise: a second comparator having two inputs, one input connected to a reference voltage and a second input connected to the output terminal of the first transistor, the second comparator further having an output connected to the control terminals of the first and second transistors.

BRIEF DESCRIPTION OF THE DRAWINGS

In these drawings, in which like reference designations indicate like elements.

DETAILED DESCRIPTION

The characteristics and the advantages of methods and circuits according to the invention will be made clear by the following description of one of its embodiments, provided purely for guidance and without restriction, with reference to the attached drawings.

Figure 1:
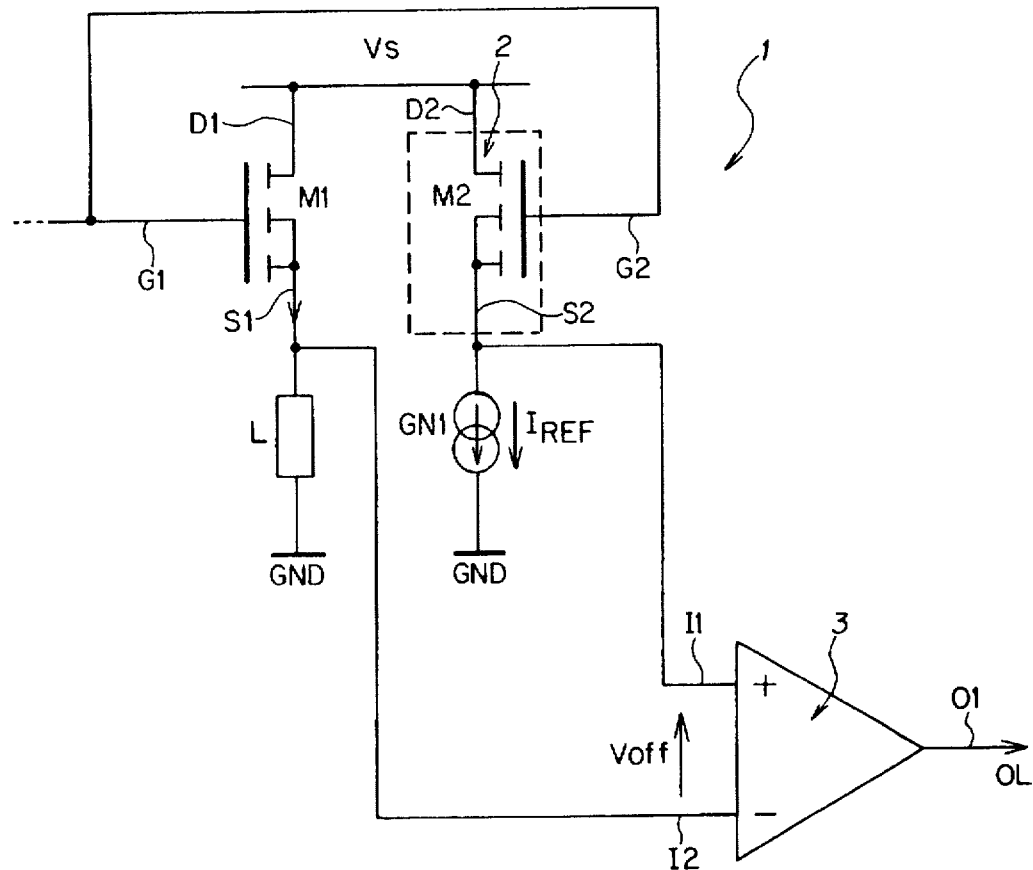
FIG. 1 is a schematic illustration of an output stage of an industrial process controller according to the known art.
Figure 2:
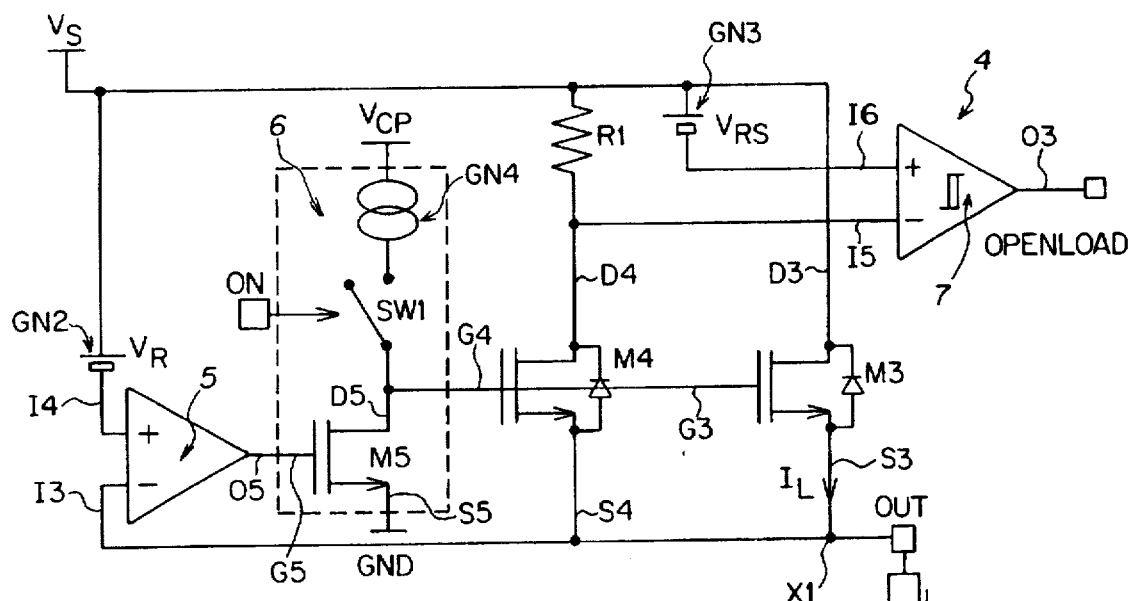
FIG. 2 is an illustration of a circuit architecture for detecting an open load according to the known art.
Figure 3:
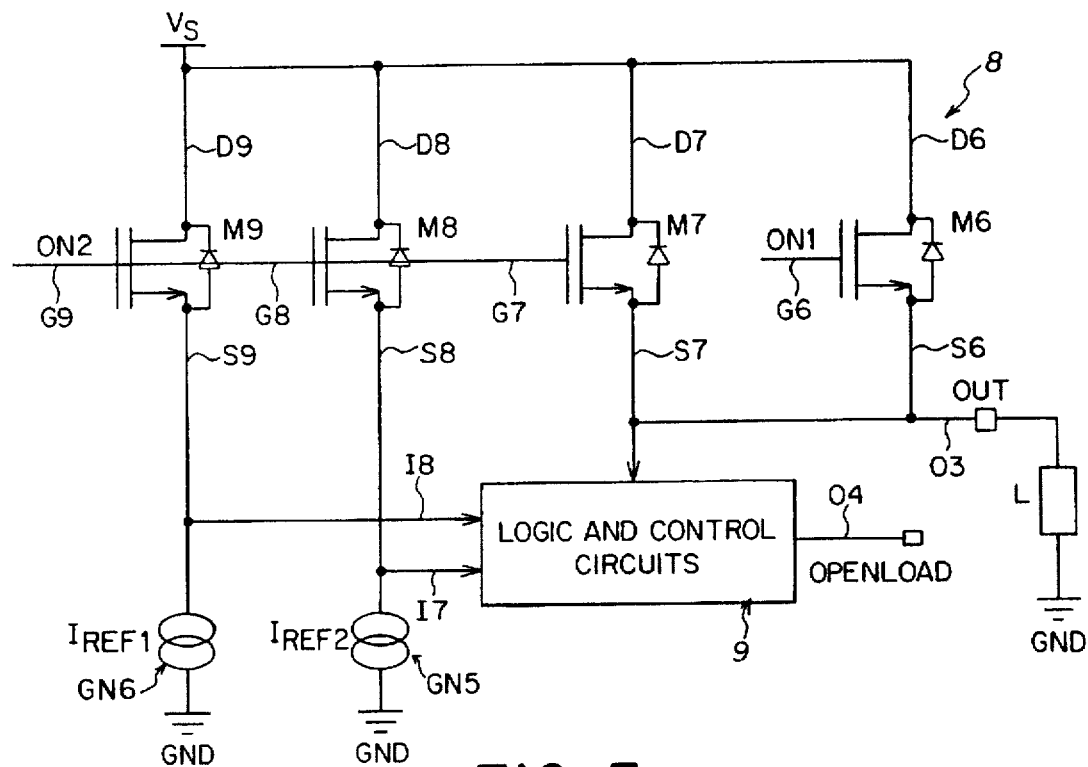
FIG. 3 shows a further known technical solution for a circuit architecture for detecting an open load according to the known art.
Figure 4:
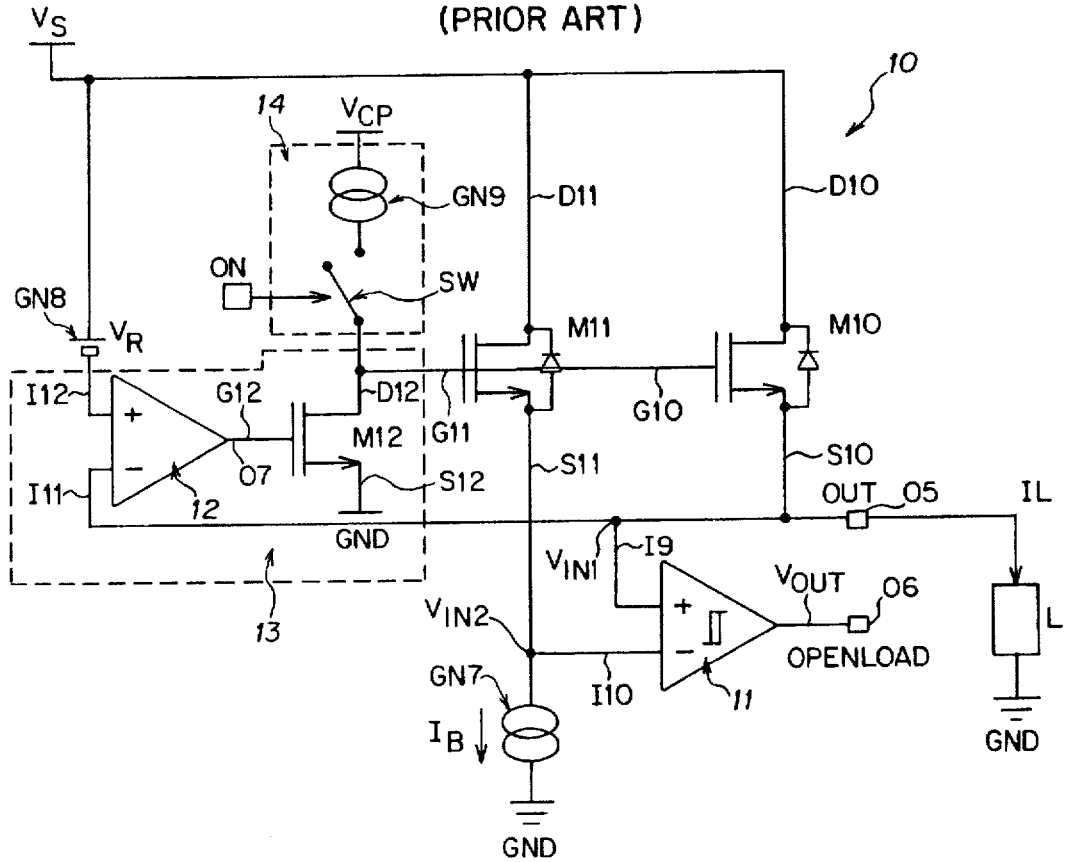
FIG. 4 is an illustration of a detection circuit embodying various aspects of the invention.

With particular reference to FIG. 4, a detection circuit 10 embodying aspects of the invention is now described.

The circuit 10 comprises a MOS power transistor M10, which will be called the main transistor, connected between a first power supply voltage reference Vs and a first output terminal O5. There is an auxiliary MOS transistor M1 1 having a gate-drain connection in parallel with the main transistor M10.

The transistors M10 and M11 have their drain terminals D10 and D11 in common and connected to the power supply voltage reference Vs. The main transistor M10 has its source terminal S10 connected to the first output terminal O5, while the auxiliary transistor M11 has its source terminal S11 connected to a comparator with hysteresis 11.

Advantageously, the auxiliary transistor M11 may comprise a number of cells N6 which is a submultiple of the number of cells N5 contained in the main transistor M10 (N6=N5/n, where n is any whole number equal to the ratio of the areas of the transistors).

The first output terminal O5 is connected to a second voltage reference, for example an earth GND, through a load L, and to a first input I9 of the comparator with hysteresis 11.

A second input terminal I10 of the comparator with hysteresis 11, namely that connected to the source S11, is connected to the second voltage reference GND through a current generator GN7.

The comparator 11 also has an output terminal O6.

The output terminal O5 of the detection circuit 10 is also connected to a first input terminal I11 of a second comparator 12 having a second input terminal I12 connected to the first power supply voltage reference Vs through a further constant voltage generator GN8.

The comparator 12 has an output terminal O7 connected to the gate terminal of a MOS transistor M12, connected between the second voltage reference GND and a third control voltage reference $V_{CP}$.

In particular, the transistor M12 has its drain terminal D12 connected to the third control voltage reference $V_{CP}$ through an interface circuit 14 comprising a switch SW, controlled by a control signal ON, in series with a current generator GN9.

The drain terminal D12 is connected to the gate terminals G10 and G11 of the main transistor M10 and auxiliary transistor M11 respectively.

The comparator 12 and the MOS transistor M12 form a negative feedback control circuit 13 between the output terminal O5 and the gate terminals G10 and G11 of the main transistor M10 and auxiliary transistor M11.

To make it possible to measure an appreciable voltage between the source and drain terminals of the main transistor M10 and the auxiliary transistor M11 even at very low currents, both these transistors are maintained by the negative feedback control circuit 13 in the near-saturation operating region.

For this purpose, the first input I9 of the comparator 11, which also coincides with the source terminal S10 of the main transistor M10 is maintained at a predetermined voltage $V_R$ by the control circuit 13.

The current $I_L$ is detected by comparing the voltage of the source terminal S 11 of the auxiliary transistor M11, biased by the reference current generated by the current generator GN7 to a predetermined voltage $V_R$, with the voltage of the source terminal S10 of the power transistor M10 biased by the current $I_L$ flowing in the load L.

This comparison is made by the comparator with hysteresis 11 and the result $V_{OUT}$ is present on the output terminal O6 of this comparator 11.

Advantageously, the main transistor M10 and the auxiliary transistor M11 have their gate terminals G10 and G11 connected to each other, and are therefore controlled by the same circuit 13 through the interface circuit 14.

The operation of the detection circuit 10 in different conditions of operation of the load L will now be examined.

For high load currents, both transistors M10 and M11 are completely on, in other words they operate in the saturation region as switches, and the feedback loop formed by the control circuit 13 is open.

When the load current decreases, the voltage drop across the saturation resistance of the power transistor M10 decreases.

When this drop reaches the value of the reference voltage $V_R$, the feedback loop is closed, holding the transistors M10 and M11 in the near-saturation operating region.

The control circuit 13 therefore permits very precise measurement of the voltage between the drain and source terminals of the power transistor M10, by determining its value for low output currents, in other words when the load L is open.

The current is detected by means of the comparator 11, by comparing the voltage of the source terminal S11 of the auxiliary transistor M11, biased by the current $I_B$ supplied by the generator GN7, with the voltage of the source terminal S10 of the main power transistor M10, biased by the load current $I_L$.

Advantageously, the biasing current $I_B$ may be set equal to $I_s/n$ where $I_s$ is a threshold current for the detection of the open condition of the load L and n is the ratio of the areas of the power transistors, in other words the ratio between the number of cells N5 of the main power transistor M10 and the number of cells N6 of the auxiliary transistor M11.

The output voltage of the comparator 11 therefore changes state when the load current $I_L$ reaches the threshold current value $I_s$.

In particular, for load currents $I_L$ greater than the threshold value $I_S$, the voltage of the source terminal S 11 of the auxiliary transistor M 11 is greater than the voltage of the output terminal O5; in these conditions, the voltage present on the output terminal O5 of the comparator 11 is at a low level V0.

Conversely, if the load current $I_L$ goes below the threshold $I_S$, the voltage of the source terminal S11 of the auxiliary transistor M11 goes below the voltage of the output terminal O5, causing this terminal O5 to switch to a high value V1, thus signalling the open condition of the load L.

For this purpose, the circuit 10 in FIG. 4 uses a biasing current $I_B$ n times smaller than the source current $I_s$, where n is the ratio between the number of cells contained in the main and auxiliary transistors.

It should be noted that the load current $I_L$ at which the negative feedback control circuit 13 becomes a closed loop is greater than the open load detection threshold current $I_S$. The load voltage present on the output terminal O5 decreases in a linear way with the decrease of the load current $I_L$ to the load L, until the load voltage reaches and falls below threshold voltage $V_R$ generated by the voltage generator GN8. Then the negative feedback comes into play.

The principal advantages of this solution are as follows:

the main and auxiliary transistors M10 and M11 have their gate terminals G10 and G11 in common and therefore require only one driver; this results in a simplicity of circuit design which decreases the cost of the device;

the transistors M10 and M11 also have their drain terminals D10 and D11 in common; they may therefore be made in a single epitaxial pocket and with any technology, and with increased precision of the circuit operation due to the better coupling of the structures;

the drain-source voltage of the auxiliary transistor M11 is not altered by the presence of a detection resistance and, when the load current $I_L$ is near the threshold value $I_{t}$, is equal to the drain-source voltage of the main transistor M10; this further improves the precision of measurement;

there is no noise component in the output voltage, since there is no switch between the main transistor M10 and the auxiliary transistor M11.

The applicant has implemented the circuit solution shown in FIG. 4 in BCD technology, using a main power transistor M10 of the vertical DMOS type comprising N5=18000 cells and an auxiliary transistor made in the same pocket with a cell ratio n=20.

Since the saturation resistance of the power transistor used is 70 mΩ and, at the nominal current of 2.5 A, the voltage drop on the output terminal is equal to 175 mV, a reference voltage $V_R$ of 60 mV was chosen, with a threshold current $I_S$ of 3 mA, with a consequent biasing current $I_B$ of 150 μA.

The results obtained by simulation of the circuit of FIG. 4, in the worst case, show variations of less than 20% in the typical value.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for detecting an open load by means of a driver having at least one main power transistor connected to the load and one auxiliary transistor, the main power transistor and the auxiliary transistor having gates connected together and the auxiliary transistor having an output terminal, comprising the steps of:

biasing the auxiliary transistor with a constant value of biasing current;

maintaining the main power transistor and the auxiliary transistor in a near saturation operating region; and comparing a first voltage present on a terminal of the main transistor connected to the load with a second voltage present on the output terminal of the auxiliary transistor.

2. The method according to claim 1, further comprising the step of:

holding the second voltage constant at a reference value by applying the biasing current to the output terminal of the auxiliary transistor.

3. The method according to claim 2, wherein the load draws a load current, further comprising the step of:

keeping the first voltage above the reference value when the load current is below a predetermined threshold value and the load current varies, by means of a negative feedback network having an input connected to the terminal of the main transistor connected to the load and having an output connected to the gate of the auxiliary transistor.

4. The method according to claim 3, wherein the main transistor and auxiliary transistor are field-effect transistors and further comprising the step of:

keeping said main transistor and auxiliary transistor in the near-saturation operating region by action of the negative feedback network when the load current varies.

5. The method according to claim 4, further comprising the step of:

setting the biasing current equal to a ratio between the threshold value and the ratio of the areas of the main and auxiliary transistors.

6. A circuit for detecting an open load, comprising:

a main transistor having a gate terminal and having an output terminal connected to the load;

an auxiliary transistor having a gate terminal connected to the gate terminal of the main transistor;

a control circuit connected between the output terminal of the main transistor and the gate terminal of the auxiliary transistor, maintaining the main transistor and auxiliary transistor in a near saturated condition;

a comparator having an output carrying a voltage indicative of the open load, a first input connected to the output terminal of the said main transistor and a second input connected to a terminal of the auxiliary transistor; and a biasing circuit for the auxiliary transistor connected between the second input and a voltage reference.

7. The circuit according to claim 6, wherein said main transistor comprises:

a number of elementary cells, the number of cells equal to a whole number multiplied by a number of elementary cells contained in the auxiliary transistor.

8. The circuit according to claim 6, wherein said biasing circuit comprises:

a current generator which supplies a biasing current equal to a ratio between a threshold value and the ratio of the areas of the main transistor and auxiliary transistor.

9. The circuit according to claim 6, wherein said comparator has hysteresis.

10. The circuit according to claim 6, wherein said main transistor and auxiliary transistor are field-effect transistors and have their gate terminals in common and connected to an interface circuit comprising a second voltage reference and a switch controlled by a control signal.

11. The circuit according to claim 6, wherein said main transistor and auxiliary transistor have their drain terminals in common and connected to a power supply defined relative to the voltage reference.

12. A circuit for detecting an open load, comprising:

means, having a control terminal and an output terminal, the output terminal connected to the load, for supplying to the load a load current;

means, having a control terminal and an output terminal, the output terminal connected to a biasing circuit supplying a constant current, for establishing a reference voltage;

means, having an output indicative of the open load and input terminals connected to the output terminals of the means for supplying and the means for establishing, for comparing the reference voltage with a voltage produced by supplying to the load the load current and setting the output indicative of the open load according to the comparison; and means, connected to the output terminal of the means for supplying, for keeping the means for supplying and the means for establishing in a near-saturation operating region.

13. The circuit according to claim 12, the means for keeping further comprising:

a control circuit having an output connected to the control terminals of the means for supplying and the means for establishing, whereby the load current is modulated.

14. A circuit for detecting an open load, comprising:

means, having a control terminal and an output terminal, the output terminal connected to the load, for supplying to the load a load current;

means, having a control terminal and an output terminal, the output terminal connected to a biasing circuit, for establishing a reference voltage;

means, having an output indicative of the open load and input terminals connected to the output terminals of the means for supplying and the means for establishing, for comparing the reference voltage with a voltage produced by supplying to the load the load current and setting the output indicative of the open load according to the comparison; and a control circuit having an output connected to the control terminals of the means for supplying and the means for establishing, whereby the load current is modulated, the control circuit having means, having an input connected to the output terminal of the means for supplying, for controlling the output of the control circuit to select a predetermined current operating point of the means for supplying.

15. A circuit for detecting an open load, comprising:

a first transistor having an output terminals supplying a current to the load, the first transistor also having a control terminal;

a second transistor having an output terminal held at a constant voltage by a biasing current applied thereto and having a control terminal connected to the control terminal of the first transistor;

a feedback circuit connected to the output terminal of the first transistor and responsive to a voltage present thereat and producing an output connected to the control terminals of the first and second transistors, operating to hold the first and second transistors in a near-saturation condition; and a first comparator having two inputs connected to the output terminal of the first transistor and the output terminal of the second transistor respectively, the first comparator having an output carrying a voltage indicative of the open load.

16. The circuit according to claim 15, wherein the first transistor and the second transistor are field effect transistors.

17. The circuit according to claim 16, wherein the feedback circuit further comprises:

a second comparator having two inputs, one input connected to a reference voltage and a second input connected to the output terminal of the first transistor, the second comparator further having the output connected to the control terminals of the first and second transistors.

* * * * *